(12) United States Patent
Yamada et al.

(10) Patent No.: US 8,597,767 B2
(45) Date of Patent: Dec. 3, 2013

(54) OPTICAL ELEMENT, ROLLER TYPE NANOIMPRINTING APPARATUS, AND PROCESS FOR PRODUCING DIE ROLL

(75) Inventors: Nobuaki Yamada, Osaka (JP); Akiyoshi Fujii, Osaka (JP); Tokio Taguchi, Osaka (JP); Hidekazu Hayashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 513 days.

(21) Appl. No.: 12/735,297

(22) PCT Filed: Nov. 19, 2008

(86) PCT No.: PCT/JP2008/071036
§ 371 (c)(1),
(2), (4) Date: Jun. 30, 2010

(87) PCT Pub. No.: WO2009/110139
PCT Pub. Date: Sep. 11, 2009

(65) Prior Publication Data
US 2010/0284087 A1    Nov. 11, 2010

(30) Foreign Application Priority Data

Mar. 4, 2008   (JP) .................. 2008-053780

(51) Int. Cl.
  *D06N 7/04*    (2006.01)
  *B32B 3/00*    (2006.01)
  *B32B 3/02*    (2006.01)
  *B32B 3/06*    (2006.01)
(52) U.S. Cl.
  USPC ........... 428/142; 428/141; 428/156; 428/157; 428/172

(58) Field of Classification Search
  USPC ............ 428/141, 142, 172, 156, 157; 216/10; 359/580
  See application file for complete search history.

(56) References Cited

U.S. PATENT DOCUMENTS

| | | |
|---|---|---|
| 2002/0044356 A1 | 4/2002 | Arakawa et al. |
| 2003/0205475 A1 | 11/2003 | Sawitowski |
| 2003/0214739 A1 | 11/2003 | Funamoto et al. |
| 2004/0163441 A1 | 8/2004 | Sawitowski |
| 2004/0188874 A1 | 9/2004 | Hikita et al. |
| 2005/0079331 A1 | 4/2005 | Ikeda et al. |
| 2005/0104253 A1 | 5/2005 | Katsumoto et al. |
| 2006/0050387 A1 | 3/2006 | Arakawa et al. |
| 2006/0228592 A1* | 10/2006 | Stover et al. ............ 428/910 |

(Continued)

FOREIGN PATENT DOCUMENTS

| | | |
|---|---|---|
| CA | 2407209 A1 | 10/2002 |
| CN | 1455270 | 11/2003 |

(Continued)

*Primary Examiner* — Maria Veronica Ewald
*Assistant Examiner* — Nancy Rosenberg
(74) *Attorney, Agent, or Firm* — Harness, Dickey & Pierce, P.L.C.

(57) ABSTRACT

To provide an optical element having excellent adhesion to a lamination film, a roller nanoimprint apparatus, and a production method of a mold roller are disclosed. In at least one embodiment of the present invention, an optical element includes a nanostructure film including recesses and protrusions in nanometer size formed continuously on a surface of the nanostructure film and a lamination film laminated on the nanostructure film. The nanostructure film includes a nanostructure-free region free from the recesses and protrusions in nanometer size in both ends along a longitudinal direction of the nanostructure film.

8 Claims, 5 Drawing Sheets

(56) References Cited

U.S. PATENT DOCUMENTS

| | | | |
|---|---|---|---|
| 2007/0140900 A1 | 6/2007 | Wang et al. |
| 2007/0159698 A1 | 7/2007 | Taguchi et al. |
| 2007/0235342 A1 | 10/2007 | Matsuo et al. |
| 2008/0032058 A1 | 2/2008 | Arakawa et al. |
| 2009/0194914 A1 | 8/2009 | Uozu et al. |
| 2009/0211912 A1 | 8/2009 | Taguchi et al. |
| 2009/0252825 A1 | 10/2009 | Taguchi et al. |

FOREIGN PATENT DOCUMENTS

| | | |
|---|---|---|
| CN | 1534314 | 10/2004 |
| CN | 1591047 | 3/2005 |
| CN | 1754824 | 4/2006 |
| EP | 1 473 594 | 11/2004 |
| EP | 1643546 | 4/2006 |
| JP | 4265729 A | 9/1992 |
| JP | 4265816 A | 9/1992 |
| JP | 2001264520 A | 9/2001 |
| JP | 200343203 | 2/2003 |
| JP | 2003531962 T | 10/2003 |
| JP | 2004223836 A | 8/2004 |
| JP | 2005144698 A | 6/2005 |
| JP | 2005156695 A | 6/2005 |
| JP | 200773696 | 3/2007 |
| JP | 2007203576 A | 8/2007 |
| JP | 4420967 A | 3/2009 |
| JP | 4368384 B2 | 11/2009 |
| WO | WO 2008/001847 | 1/2008 |
| WO | WO-2009107294 A1 | 9/2009 |

* cited by examiner (a)

(b)

(c)

(d)

(a)

(b)

OPTICAL ELEMENT, ROLLER TYPE NANOIMPRINTING APPARATUS, AND PROCESS FOR PRODUCING DIE ROLL

TECHNICAL FIELD

The present invention relates to an optical element, a roller nanoimprint apparatus, and a production method of a mold roller. More particularly, the present invention relates to an optical element, a roller nanoimprint apparatus, and a production method of a mold roller, suitable for producing a rolled optical element with a low reflective surface.

BACKGROUND ART

Nanoimprint technology in which a resin material coated on a substrate is embossed with a recess-protrusion pattern in tens of nanometers to hundreds of nanometers of a mold by pressing the two together has attracted attention recently. Applications of nanoimprint technology to optical materials, finer ICs, substrates for clinical laboratory test, and the like are now being developed and researched. Nanoimprint technology advantageously allows a component with a variety of characteristics to be produced at low costs as compared with conventional pattern-forming processes involving lithography and etching. This is because nanoimprinters have a simpler configuration and are less expensive than conventional apparatuses and further because it takes a short time to mass-produce components with the same shape.

Thermal nanoimprint and UV nanoimprint are known as nanoimprint technology. According to UV nanoimprint, for example, a mold with a nanosized recess-protrusion pattern is pressed against a UV-curable resin thin film formed on a transparent substrate, and the film is irradiated with UV rays, thereby producing a thin film with nanostructures on the transparent substrate. According to thermal nanoimprint, for example, a transparent substrate and a mold that are heated to the softening temperature of the transparent substrate or high are pressed against each other, thereby forming nanostructures (recesses and protrusions) on the transparent substrate. In a study, flat molds and batch process are commonly employed in the UV nanoimprint and the thermal nanoimprint.

With respect to technologies employing a batch process for forming nanostructures, for example, Patent document 7 discloses photo nanoimprint including pressing a mold into a photosensitive dry film and photoirradiation of the film.

In order to mass-produce thin films with nanostructures at low costs by nanoimprint technology, a roll-to-roll process is preferable to the batch process. The roll-to-roll process using a mold roller allows continuous production of the film with nanostructures.

With respect to nanoimprint technology involving the roll-to-roll process, for example, Patent Document 5 discloses that a pattern of a small mold roller is transferred onto a large mold roller while the pattern is extended by moving the small mold roller.

With respect to rollers used in the roll-to-roll process in technologies other than nanoimprint technology, for example, Patent Documents 6 discloses a method of producing a roller with a recess-protrusion pattern directly formed thereon.

Patent Document 1 discloses moth-eye structure(s) known as one type of the nanostructures in optical materials (optical elements). The moth-eye structures include, for example, nanosized corn-shaped protrusions formed on a transparent substrate surface. According to optical materials with the moth-eye structures, a reflected light amount can be dramatically decreased because a refractive index continuously changes from air to a transparent substrate and so incident light does not recognize the surface of the transparent substrate as an optical surface. In view of this, for example, Patent Documents 2 to 4 disclose, as a technology of producing optical materials with nanostructures, a method of using an aluminum substrate having a surface with nanosized cavities formed thereon by anodizing. According to this method involving anodizing, for example, nanosized cavities can be formed on a columnar mold roller surface in a random placement and in a uniform distribution, and therefore seamless nanostructures needed for continuous production can be formed on the surface.

[Patent Document 1]
    Japanese Kokai Publication No. 2001-264520
[Patent Document 2]
    Japanese Kohyo Publication No. 2003-531962
[Patent Document 3]
    Japanese Kokai Publication No. 2003-43203
[Patent Document 4]
    Japanese Kokai Publication No. 2005-156695
[Patent Document 5]
    Japanese Kokai Publication No. 2007-203576
[Patent Document 6]
    Japanese Kokai Publication No. 2005-144698
[Patent Document 7]
    Japanese Kokai Publication No. 2007-73696

DISCLOSURE OF INVENTION

According to the conventional technology of producing films (e.g., optical films) with continuously formed nanostructures by the roll-to-roll process, films having been provided with nanostructures have difficulties in handling. Specifically, it is difficult to attach to a film with nanostructures a protection film (hereinafter, also referred to as a "lamination film") for preventing the nanostructures from being scratched and contaminated in subsequent steps because adhesive materials of the protection film have poor adhesion to the nano-level recesses and protrusions of the film. If a material with strong adhesiveness is used as the adhesive materials of the protection film in order to eliminate such problems, paste materials, solvents contained in the paste materials, and the like may be left in nanostructures, specifically, transferred on the film with nanostructures. Therefore, if such films with nanostructures are used for optical elements for display devices, display unevenness might be caused. Particularly when the nanostructure film having moth-eye structures is used for a surface of a polarizer in a liquid crystal display device, a laminated body composed of the lamination film and the nanostructure film formed on a base film is subjected to wet processes such as an adhesion-imparting process and a cleaning step. Therefore, if the nanostructure film and the lamination film are not sufficiently in contact with each other, the solvents may enter between the films and the nanostructures may be affected (eaten away) by the solvents.

The present invention has been made in view of the above-mentioned state of the art. The present invention has an object to provide an optical element having excellent adhesion to a lamination film, a roller nanoimprint apparatus, and a production method of a mold roller.

The present inventors made various investigations on an optical element having excellent adhesion to a lamination film, a roller nanoimprint apparatus, and a production method of a mold roller, and noted a region where nanostructures are to be formed. The inventors found that according to conventional technologies for producing a nanostructure film having nanostructures (nanometer sized recesses and protrusions) continuously formed on a surface thereof by a roll-to-roll process, the nanostructures (nanometer sized recesses and protrusions) are formed over an entire surface of the nanostructure film, and therefore the nanostructure film has poor adhesion to the lamination film. The inventors further found that lamination film can be sufficiently in contact with a nanostructure-free region that is formed in two longitudinal ends of the nanostructure film and has no nanometer-sized recesses and protrusions. Thus, the above-mentioned problems have been admirably solved, leading to completion of the present invention.

That is, the present invention is an optical element, comprising a nanostructure film including recesses and protrusions in nanometer size formed continuously on a surface of the nanostructure film, wherein the nanostructure film includes a nanostructure-free region free from the recesses and protrusions in nanometer size in both ends along a longitudinal direction of the nanostructure film.

The lamination film can be sufficiently in contact with such nanostructure-free regions. As mentioned above, the nanostructure-free regions are formed in the respective longitudinal ends of the nanostructure film, and therefore even if the nanostructure film is subjected to a wet process, a solvent is effectively prevented from entering a region (hereinafter also referred to as a "nanostructure region") where nanometer-sized recesses and protrusions are formed.

Thus, according to the present invention, adhesion between the nanostructure film and the lamination film for protecting the nanostructure film (suitably in a roll of the attached two films) is improved, and thereby the nanostructure film is protected from being contaminated and scratched in production processes.

In the present description, more specifically, the nanometer-sized recesses and protrusions each preferably have a height and/or a width (suitably a height and a width) of 1 nm or larger and smaller than 1 μm (=1000 nm).

In the present description, the nanometer sized recesses and protrusions are also referred to as a nanostructure or a nanostructural body. The nanostructure film may have any thickness and may be a sheet.

The configuration of the optical element according to the present invention is not particularly limited. The optical element may or may not include other components as long as it essentially includes such components. The optical element of the present invention has excellent adhesion to a lamination film, and therefore the optical element preferably further includes a lamination film. That is, it is preferred that the optical element further comprises a lamination film laminated on the nanostructure film. It is more preferred that the optical element is a rolled optical element formed by rolling up (winding) a laminated body of the nanostructure film and the lamination film.

Examples of the nanometer-sized recesses and protrusions include, but not limited to, moth-eye structures and wire grid structures. Moth-eye structures are more preferred. That is, it is preferred that the nanostructure film includes a moth-eye structure including a plurality of conical (corn shaped) protrusions each having a size smaller than a wavelength of visible light. Owing to the moth-eye structures, even if such an optical element (rolled optical element) of the present invention is used for polarizers of liquid crystal display devices, and the nanostructure film is subjected to wet processes such as an adhesion-imparting step and a cleaning step, a solvent is prevented from entering a region where moth-eye structures are formed and affecting the moth-eye structures. As a result, an occurrence of display unevenness in LCD devices is effectively suppressed and an amount of reflected light can be significantly decreased.

The present invention is also a roller nanoimprint apparatus (hereinafter, also referred to as a "first nanoimprinter of the present invention") for producing the optical element of the present invention, the roller nanoimprint apparatus comprising a mold roller including an outer circumference surface with a recess-protrusion pattern for forming the recesses and protrusions in nanometer size, wherein a relationship of A>B>C is satisfied, where A is a length in an axial direction of the mold roller; B is a width of the nanostructure film; and C is a width of a region where the recess-protrusion pattern is formed.

The first nanoimprinter allows simultaneous formation of the nanostructure region and the nanostructure-free regions formed in the respective longitudinal ends of the nanostructure film. That is, the optical element of the present invention can be efficiently produced. Further, the length in an axial direction (specifically, length in the rotation axial direction) of the mold roller is larger than the width of the nanostructure film, and therefore the nanostructure-free regions and the nanostructure region can be formed without losing the flatness of the nanostructure film. In the present description, the width of a region where a recess-protrusion pattern is formed means the length of a region including a recess-protrusion pattern in the axial direction (specifically, the rotation axial direction) of the mold roller.

The first nanoimprinter of the present invention is not particularly limited and may or may not include other components as long as it essentially includes the above-mentioned components.

The present invention is also a roller nanoimprint apparatus (hereinafter, also referred to as "a second nanoimprinter of the present invention") for producing the optical element of the present invention, comprising a mold roller including an outer circumference surface with a recess-protrusion pattern for forming the recesses and protrusions in nanometer size, wherein the nanostructure film includes a base film and an ionizing radiation-curable resin on the base film, and the recesses and protrusions in nanometer size are continuously formed in the ionizing radiation-curable resin, wherein a region where the recess-protrusion pattern is formed has a width larger than that of a region where an ionizing radiation-curable resin is coated on the base film.

Thus, the nanostructure region and the nanostructure-free regions formed in the respective longitudinal ends of the nanostructure film can be simultaneously formed by using UV nanoimprint and the like. That is, the optical element of the present invention can be efficiently produced. The size of the nanostructure region can be easily changed only by changing the width of the region where the ionizing radiation-curable resin is coated. Therefore, the design of the nanostructure film, for example, the width of the nanostructure film, can be easily changed. The second nanoimprinter of the present invention preferably further includes a coating unit for coating the ionizing radiation-curable resin on the base film. In the present description, the width of the region where the ionizing radiation-curable resin is coated means the length in the direction perpendicular to the longitudinal direction of the nanostructure film of a region where the ionizing radiation-curable resin is coated. In the present description, examples of the ionizing radiation-curable resin include a resin cured by UV rays, what is called a UV-curable resin.

The second nanoimprinter of the present invention is not particularly limited and may or may not include other components as long as it essentially includes the above-mentioned components.

The present invention is also a production method of a mold roller for a roller nanoimprint apparatus for producing the optical element of the present invention, particularly the optical element including a nanostructure film having moth-eye structures with a plurality of conical (corn shaped) protrusions each having a size smaller than a wavelength of visible light, the production method comprising the steps of:

anodizing an aluminum tube in which a region other than a region where a concave pattern for forming the plurality of conical (corn shaped) protrusions is to be formed is masked with a masking material; and etching the aluminum tube, the anodizing and the etching being repeated.

By using such a method, a mold roller that is an aluminum tube having no concave pattern for forming a plurality of conical protrusions in both ends thereof, that is, a mold roller preferably used for producing the optical element of the present invention can be easily produced.

The production method of the mold roller according to the present invention is not particularly limited as long as these steps are included. The production method may include other steps.

Effect of the Invention

According to the optical element, the roller nanoimprint apparatus, and the production method of the mold roller of the present invention, a rolled optical element having excellent adhesion to a lamination film can be provided. Therefore, a nanostructure film masked with the lamination film can be provided, and the nanostructure film can be protected from being scratched and contaminated, and being subjected to liquid agents, in the process. As a result, an yield of products including the optical element having a surface with nanostructures in subsequent processes, for example, a paste coating process, a polarizer attachment process, and a cutting process, can be significantly improved.

BEST MODES FOR CARRYING OUT THE INVENTION

The present invention is mentioned in more detail below with reference to Embodiments and Examples using drawings, but not limited thereto.
Embodiment 1
Basic Structure FIG. 1 is a view illustrating a moth-eye structure (a view illustrating a principle of a continuous change in a refractive index in a surface and a significant decrease in a reflection at an interface). FIG. 1(a) is a cross sectional view schematically showing the moth-eye structure. FIG. 1(b) shows a change in the refractive index in the moth-eye structure.

For producing nanostructures such as moth-eye structures and wire grid structures, the following nanoimprint is generally used. The nanoimprint includes the steps of pressing an ionizing radiation-curable resin, such as a UV-curable resin, coated on a substrate film (base film) to be sufficiently in contact with a mold for the nanostructures; and irradiating the ionizing radiation-curable resin with energy beams such as UV rays, with the resin being in contact with the mold, thereby curing the resin. The nanostructures formed by the method are nanosized recesses and protrusions formed on a surface of the base film. In particular, the moth-eye structures are numerous nanosized conical protrusions 32 formed on a surface of the ionizing radiation-curable resin (resin film 31), as shown in FIG. 1(a). As shown in FIG. 1(b), the structure capable of continuously changing a refractive index of light from air to the inside of the resin film is employed. For this reason, adhesion between the conventional nanostructure film having moth-eye structures and the lamination film is low, and therefore it is difficult to protect the surface with moth-eye structures using the lamination film. In contrast to this, if a lamination filmhaving improved adhesion is used, adhesion between the films is improved, but solvents, lower molecular weight oligomers, plasticizers, or the like enter the moth-eye structures (nanosized recesses and protrusions), resulting in an increase in reflectance of the nanostructure film. A display device including such a nanostructure film causes display unevenness.

The present inventors have devised a structure in which transfer of substances, such as solvents, lower molecular weight oligomers, and plasticizers, into the base film can be effectively suppressed while adhesion between the lamination film and the base film is maintained, when the nanostructures are continuously produced (produced with a roller) on the base film.

FIG. 2 is a schematic view showing the rolled optical element in accordance with Embodiment 1. FIG. 2(a) is a general view thereof. FIG. 2(b) is a cross-sectional view thereof taken along line X-Y in FIG. 2(a).

A rolled optical element 21 in accordance with the present Embodiment includes a band-shaped nanostructure film 20 and a lamination film (not shown, also referred to as a masking film) with a band shape similar to the nanostructure film 20. The nanostructure film 20 and the lamination film form a rolled laminated body.

As nanostructures formed on a lamination film-side surface of the nanostructure film 20, the moth-eye structures similar to the ones illustrated in FIG. 1 are continuously formed in a band shape. Such a nanostructure film 20 is an optical sheet having nanostructures.

The lamination film is a protective film having a width substantially the same as that of the nanostructure film 20; includes an adhesion layer that is composed of adhesive materials, such as a paste, on a nanostructure film 20-side surface; and is detachably attached to the nanostructure film 20 surface having the moth-eye structures.

The nanostructure film 20 in accordance with the present Embodiment has nanostructure-free regions 23, which are regions where moth-eye structures are not formed, in both ends thereof along the longitudinal direction of the nanostructure film. Specifically, the nanostructure film 20 includes a nanostructure region 22 in which moth-eye structures are continuously formed in a band shape, and band-shaped nanostructure-free regions 23 in which no moth-eye structures are formed.

Adhesion between the both ends of the nanostructure film 20 and the lamination film can be sufficiently secured by forming flat nanostructure-free regions 23 having no recesses and protrusions in the ends of the nanostructure film 20 when providing the nanostructure film 20 with the moth-eye structures. Therefore, the nanostructure film 20 can be covered with the lamination film (the lamination film is attached to the nanostructure film 20) during the nanostructure film processing steps following the step of forming the rolled optical element 21. As a result, the moth-eye structures can be protected from contamination, scratching, liquid agents and the like during the steps. In addition, the need to use adhesive materials having high adhesion, which is conventionally used, for the lamination film is eliminated, and therefore the nanostructure film 20 is effectively prevented from being contaminated with the adhesive materials of the lamination film. Further, even if the nanostructure film 20 is subjected to a wet process, entry of solvents into the nanostructure region 22 can be effectively suppressed because the nanostructure-free regions 23 are provided in the respective ends of the nanostructure film 20.

The nanostructure-free regions 23 do not need to be strictly flat as long as adhesion between the nanostructure-free regions 23 and the lamination film is sufficiently secured. The degree of flatness is not particularly limited, and is preferably one provided in the base film.

Nanostructures are shown relatively larger in FIG. 2(b), but the actual nanostructures have a very small height in nano scale. Therefore, the nanostructure region 22 and the nanostructure-free regions 23 have little difference in height therebetween.

The minimum width of the nanostructure-free region 23 is not particularly limited as long as adhesion between the region 23 and the lamination film can be substantially secured, and is specifically preferably 20 mm or more. The proportion of the width of the nanostructure-free region 23 relative to the width of the nanostructure film 20 may be suitably determined depending on the width of the nanostructure film 20, and is specifically preferably 1% or more. The maximum width of the nanostructure-free region 23 is preferably made as small as possible in order to secure a high productivity of the nanostructure patterned region. More specifically, the maximum width of the nanostructure-free region 23 is preferably about 40 mm or less. As used herein, the width of the film (such as the nanostructure film 20 and the lamination film) means the length of the film in a direction perpendicular to the longitudinal direction of the film, the width of the nanostructure-free region means the length of the nanostructure-free region in a direction perpendicular to the longitudinal direction of the film, and the width of the nanostructure region means the length of the nanostructure region in a direction perpendicular to the longitudinal direction of the film.

Process Conditions

FIG. 3 is a schematic view showing the rolled optical element and the mold roller in accordance with Embodiment 1, and shows the relationship of the length A in the axial direction of the mold roller, the width C of the recess-protrusion patterned region of the mold roller, and the width B of the nanostructure film, in the production process.

As shown in FIG. 3, in the nanoimprinter, the relationship A>B>C is preferably satisfied, where the length in the axial direction (length in the rotation axial direction, i.e., the roll length) of the mold roller 15 is defined as A, the width (an effective pattern width of the mold roller) of the region 24 where the recess-protrusion pattern is formed of the mold roller is defined as C, and the width of the nanostructure film 20 having nanostructures is defined as B. If the width B of the nanostructure film 20 is larger than the roll length A of the mold roller 15, ends of the nanostructure film 20 are not within the mold roller 15 and the flatness of the nanostructure film 20 is impaired. As a result, it becomes difficult for the nanostructure film 20 to be rolled up in a rolled shape. When the process condition in which the width C of the region 24 where the recess-protrusion pattern is formed is smaller than the width B of the nanostructure film 20 is satisfied, the nanostructure-free regions 23 where no nanostructures are formed can be formed in the respective ends of the nanostructure film 20 simultaneously with the formation of the nanostructures.

As mentioned above, the nanoimprinter of the present Embodiment includes the cylindrical or columnar mold roller 15 having an outer circumference surface with a recess-protrusion pattern for nanostructures and is so designed that the relationship A>B>C is satisfied, where A is the roll length of the mold roller 15, B is the width of the nanostructure film 20, and C is the width of the region where a recess-protrusion pattern is formed. By rotating the mold roller 15 around the cylindrical axis or the columnar axis thereof, embossment to a workpiece film (nanostructure film 20) and separation from the film can be continuously performed. As a result, the nanostructure film 20 having a surface with nanostructures formed thereon can be mass-produced at fast speeds.

The mold roller 15 is preferably a hollow cylindrical roller in view of cost effectiveness, but may be a solid columnar roller.

FIG. 5 is a schematic view illustrating the production method of the rolled optical element in accordance with Embodiment 1. FIG. 5(a) is a view showing the embodiment in which no ionizing radiation-curable resin is coated on both ends of the nanostructure film. FIG. 5(b) is a cross sectional view showing the entire configuration of the roller nanoimprint apparatus in accordance with Embodiment 1.

As a method for producing the rolled optical element 21 including the nanostructure film 20 having no nanostructures in both ends thereof, the method as shown in FIG. 5(a) is preferred. The method includes: applying an ionizing radiation-curable resin 25 such as a UV-curable resin for nanostructure formation to a region other than both ends of the substrate film 12 (e.g., a sheet resin) 12 using a coating unit 26, such as a die coater and a slit coater; then contacting the ionizing radiation-curable resin to the mold roller 15; and then curing the ionizing radiation-curable resin by exposure to energy beams such as UV rays.

In this case, the mold roller 15 having no recess-protrusion pattern for forming nanostructures formed in both ends in the cylindrical axial direction or the columnar axial direction may be used, and the mold roller 15 having a recess-protrusion pattern for forming nanostructures formed over an entire outer circumference surface may be used.

FIG. 5(a) is a plan view showing an arrangement relationship of members, but the actual nanostructure film 20 (substrate film 12) is wound on the outer circumference surface of the mold roller 15 as shown in FIG. 5(b).

The production method of the rolled optical element 21 and a nanoimprinter 41, in accordance with the present Embodiment, are described in more detail with reference to FIG. 5(b).

According to the nanoimprinter 41 of the present Embodiment, first, a base film roll 11 composed of a rolled base film, such as a triacetyl cellulose (TAC) film and a polyethylene terephthalate (PET) film, is rotated to feed a belt-like base film 12 in the direction shown by the arrow in FIG. 5(b). Then the base film 12 passes through a pair of pinch rollers (supporting rollers) 13a and 13b for tension adjustment and then, an uncured ionizing radiation-curable resin such as an uncured UV-curable resin is coated thereon by a die coater 14. The ionizing radiation-curable resin is not coated on both ends of the base film 12. The base film 12 moves halfway around a columnar mold roller 15 along its outer circumference surface. At this time, the ionizing radiation-curable resin on the base film 12 is in contact with the outer circumference surface of the mold roller 15.

A rubber cylindrical pinch roller 16 is arranged to face the outer circumference surface of the mold roller 15 at the position where the base film 12 is firstly in contact with the outer circumference surface of the mold roller 15. At this position, the base film is wound between the mold roller 15 and the pinch roller 16 so that the ionizing radiation-curable resin is pressed against and sufficiently contacted to the mold roller 15, and as a result, a recess-protrusion pattern formed on the outer circumference surface of the mold roller 15 is transferred to the ionizing radiation-curable resin.

While the base film 12 travels along the outer circumference surface of the mold roller 15, the resin is irradiated with energy beams such as UV rays from the bottom side of the mold roller 15. As a result, cured is the ionizing radiation-curable resin having a surface with the recess-protrusion pattern in the inverse shape to the surface shape of the mold roller 15. The white arrow in FIG. 5(b) shows a direction of the energy beam irradiation.

After moving halfway along the outer circumference surface of the mold roller 15, the base film 12 moves along a pinch roller 17 arranged to face the outer circumference surface of the mold roller 15 and then is separated from the mold roller 15 together with the cured resin. Thus, the nanostructure film 20 having nanostructures made of the ionizing radiation-curable resin and continuously formed on its surface can be produced. In both ends of the nanostructure film 20, the base film 12 remains to be exposed because both ends of the base film 12 are not coated with the ionizing radiation-curable resin.

Then, a lamination film 19 fed from a lamination film roll 18 of the film 19 is attached to the ionizing radiation-curable resin-side surface of the nanostructure film 20 with a pinch roller 27. In this step, the lamination film 19 is sufficiently in contact with both ends of the nanostructure film 20, that is, the exposed flat base film 12 in both the ends of the nanostructure film 20. Finally, a laminated body (laminated sheet) of the lamination film 19 and the nanostructure film 20 including the base film 12 and nanostructures composed of the ionizing radiation-curable resin is rolled up to provide a rolled optical element (laminated sheet roll) 21 of the present Embodiment.

The rolled optical element 21 of the present Embodiment may be produced by thermal nanoimprint technology using a mold roller 15 described below, that is, a mold roller 15 not having a recess-protrusion pattern for forming nanostructures in both ends in its cylindrical axial or columnar axial direction.

Production Method of Mold Roller

A production method of a mold roller for forming moth-eye structures as typical nanostructures is described. FIG. 4 is a schematic view illustrating the production method of the mold roller in accordance with Embodiment 1. FIGS. 4(a) to 4(d) show the production method of the mold roller having no recess-protrusion pattern for nanostructures in both ends thereof.

The mold for moth-eye structures is generally produced by forming nano-order cavities each having a conical shape in a surface of an aluminum layer by repeating anodizing and etching for the aluminum layer. In order to produce a nanostructure film 20 having a region where no moth-eye structures are formed in both ends of the film 20 and having a region where moth-eye structures are continuously formed in the center portion of the film 20, as described in the present Embodiment, it is preferred to produce a mold roller 15, as shown in FIG. 3, in which a region where no conical concaves (cavities) are formed is formed in both ends of the mold roller 15.

For producing such a mold roller 15, when performing anodizing and etching an aluminum tube, both ends of an aluminum tube 33 the outer circumference surface of which has been polished by cut polishing and the like are first masked with a masking material 34 that has resistance to liquid agents, as shown in FIGS. 4(a) and 4(b); the aluminum tube 33 in which the ends thereof are masked with the masking material 34 is then anodized and etched in a reaction vessel 35, and the steps are repeated, for example, three times, as shown in FIG. 4(c); and the masking material 34 is finally removed as shown in FIG. 4(d). Thus, the mold roller 15 of the aluminum tube 33 having no recess-protrusion pattern (concave pattern) in both ends thereof for producing nanostructures (moth-eye structures) can be produced. Seamless moth-eye structures can be formed in the nanostructure film 20. As the masking material 34, an adhesive film composed of a film, such as a polyethylene film and a polypropylene film, and an adhesive material coated thereon may be used.

The nanostructure film 20 formed with thus-formed mold roller has a surface on which substantially conical (corn shaped) protrusions 32 with 150 to 400 nm in height (e.g., 300 nm) are formed so that a distance between peaks of adjacent ones of the protrusions is 80 to 300 nm (e.g., 200 nm) as shown in FIG. 1(a). The surface structures are commonly called moth-eye structure(s). The nanostructure films 20 with moth-eye structures are known as ultra-low reflective films having a reflectance for visible light of about 0.15%, for example. The moth-eye structures in the nanostructure film 20 include protrusions smaller than a wavelength of visible light (380 nm to 780 nm), and due to these protrusions, the refractive index of the interface is considered to continuously and gradually increase from 1.0 of the refractive index of air on the nanostructure film 20 surface to a value equivalent to the reflective index of the material of the nanostructure film 20 (1.5 in the resin film 31). As a result, no refractive-index interface substantially exists, and the reflectance on the interface of the nanostructure film 20 is sharply decreased.

In addition to the mold roller 15 with a recess-protrusion pattern directly formed thereon, the mold roller 15 may be a cylinder or column including a sheet (thin film) with a recess-protrusion pattern attached thereto may be used. For forming seamless nanostructures, the above-mentioned mold roller 15 with a recess-protrusion pattern directly formed thereon is preferred.

By masking any portion other than the both ends of the aluminum tube 33 with the masking material 34, a region in which no recess-protrusion pattern for nanostructures may be formed also, for example, in the center portion of the mold roller 15, as shown in FIG. 6. By using such a mold roller 15, a nanostructure film having nanostructure-free regions 23 in the both ends and a portion other than the both ends can be produced. Thus, the nanostructure film 20 may have the nanostructure-free regions 23, for example, in both longitudinal ends and in the center portion along the width direction of the film 20. As a result, adhesion between the nanostructure film 20 and the lamination film 19 can be further improved. In addition, a plurality of optical elements each having a small area can be efficiently produced without diminishing productivity thereof. That is, a relatively small optical element can be efficiently produced without diminishing productivity thereof. The number of the nanostructure-free region 23 formed in the center portion of the nanostructure film 20 is not limited, and may be suitably determined depending on the size of the nanostructure film 20, mole roller 15, and optical element needed.

EXAMPLE 1

A mold roller for moth-eye structures was produced by the production method of a mold roller shown in FIG. 4. As shown in FIG. 4, a recess-protrusion pattern having a width of 360 mm was formed in a center portion excluding both ends of the mold roller so that a moth-eye structure-free region with a 20 mm in width can be formed in each of both ends of a base film (nanostructure film) having a width of 400 mm. The mold roller had the roll length of 450 mm, and as the mold roller, a cylindrical body having an outer diameter of 250 mm and an inside diameter of 124 mm is used. The mold roller was then set in the nanoimprinter shown in FIG. 5(b), a UV-curable resin was coated on one surface of a PET film (product of Toray Industries, Inc.) as a base film having a width of 400 mm, and then irradiated with UV rays to cure the UV-curable resin while the PET film was pressed into the mold roller with a pressure of 200 g/cm². Thus, the nanostructure film was produced. The lamination film (ZR-701, product of FUJIMORI KOGYO CO., LTD.) was attached to the nanostructure film. The two films were attached well, and the lamination film was closely in contact with the nanostructure-free portions in the respective ends of the nanostructure film, thereby fixing the lamination film on the moth-eye structures.

EXAMPLE 2

Similarly to Example 1, a nanostructure film having moth-eye structures was produced, except that the UV-curable resin was coated only on a center portion of the PET film that is used as a base film without being coated on both ends of the PET film. The nanostructure film produced had conical protrusions constituting the moth-eye structures only in a region where the UV-curable resin was coated, and had a region where the base film is exposed in both ends of the nanostructure film. Similarly to Example 1, when the lamination film was attached to the nanostructure film, the lamination film was closely in contact with the exposed base film, thereby fixing the lamination film on the moth-eye structures.

COMPARATIVE EXAMPLE 1

A mold roller having a conical recess-protrusion pattern for forming moth-eye structures formed on an entire outer circumference surface thereof was produced, and similarly to Example 1, a nanostructure film including a base film having moth-eye structures formed on an entire surface thereof was produced. Similarly to Example 1, attachment of a lamination film to the nanostructure film was attempted. However, adhesion between the nanostructure film and the lamination film was not sufficient, and the lamination film could not be attached to the nanostructure film.

The present application claims priority to Patent Application No. 2008-53780 filed in Japan on Mar. 4, 2008 under the Paris Convention and provisions of national law in a designated State, the entire contents of which are hereby incorporated by reference.

BRIEF DESCRIPTION OF DRAWINGS

FIG. 1 is a view illustrating a moth-eye structure (a view illustrating a principle of a continuous change in a refractive index in a surface and a significant decrease in a reflection at an interface).
FIG. 1(a) is a cross sectional view schematically showing the moth-eye structure.
FIG. 1(b) shows a change in the refractive index in the moth-eye structure.

FIG. 2 is a schematic view showing the rolled optical element in accordance with Embodiment 1.
FIG. 2(a) is a general view thereof.
FIG. 2(b) is a cross-sectional view thereof taken along line X-Y in FIG. 2(a).

FIG. 3 is a schematic view showing the rolled optical element and the mold roller in accordance with Embodiment 1, and shows the relationship of the length A in the axial direction of the mold roller, the width C of a recess-protrusion patterned region of the mold roller, and the width B of the nanostructure film, in the production process.

FIG. 4 is a schematic view illustrating the production method of the mold roller in accordance with Embodiment 1.
FIGS. 4(a) to 4(d) show the production method of the mold roller having no recess-protrusion pattern for nanostructures in both ends thereof.

FIG. 5 is a schematic view illustrating the production method of the rolled optical element in accordance with Embodiment 1.
FIG. 5(a) is a view showing the embodiment in which no ionizing radiation-curable resin is coated on both ends of the nanostructure film.
FIG. 5(b) is a cross sectional view showing the entire configuration of the nanoimprinter in accordance with Embodiment 1.

FIG. 6 is a schematic view showing the rolled optical element and the mold roller in accordance with a modified example of Embodiment 1.

EXPLANATION OF NUMERALS AND SYMBOLS

Figure 1:
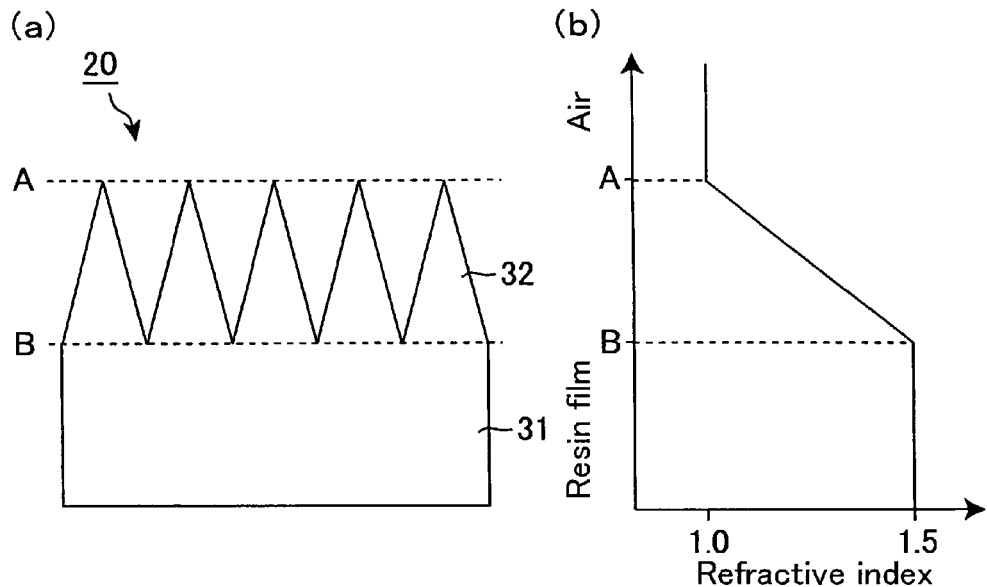
[FIG. 1]
Figure 2:
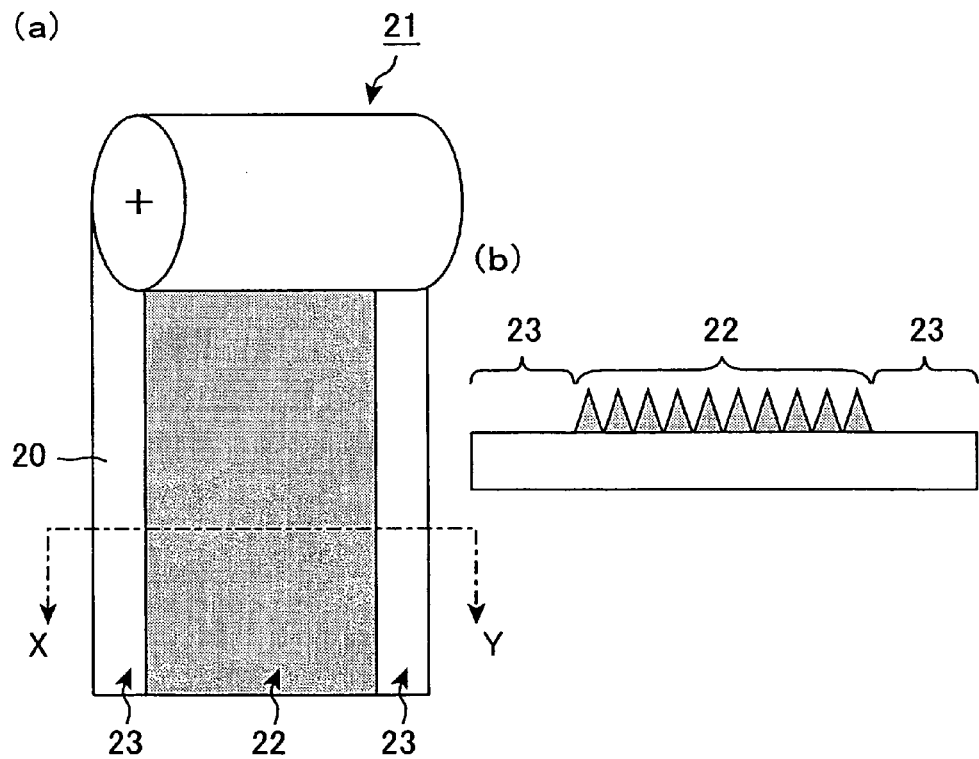
[FIG. 2]
Figure 3:
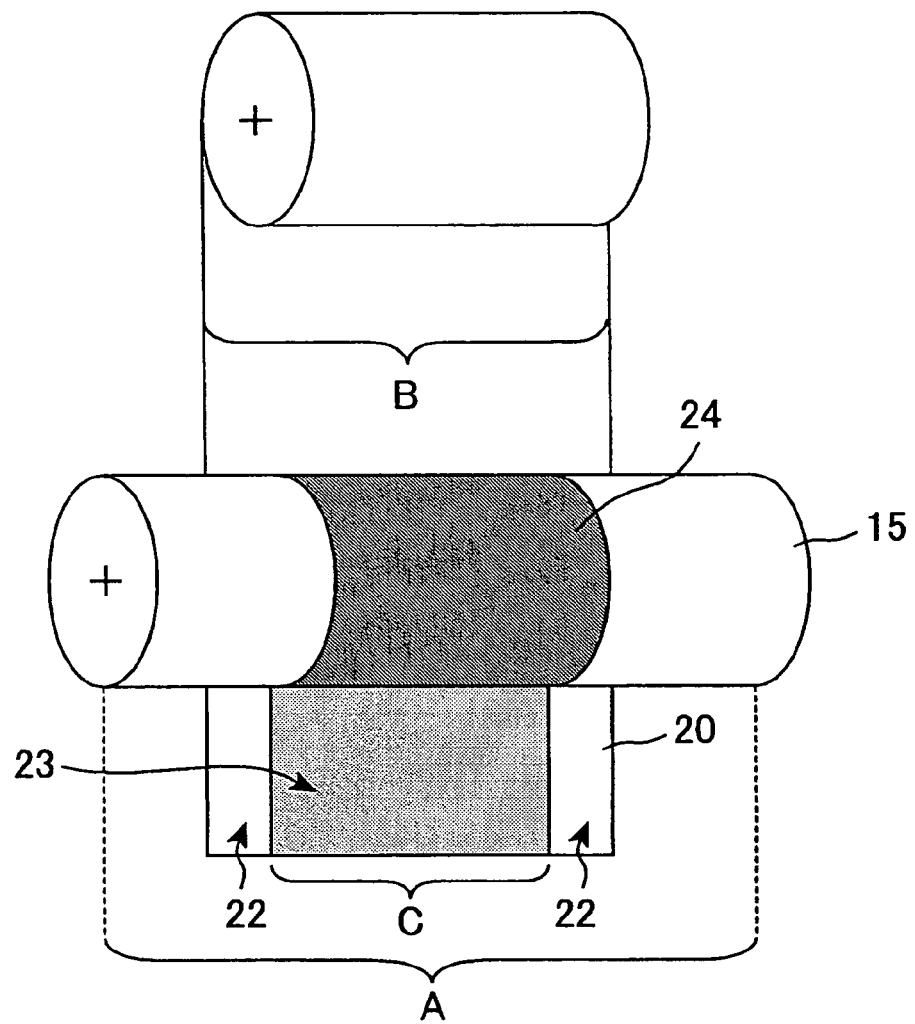
[FIG. 3]
Figure 4:
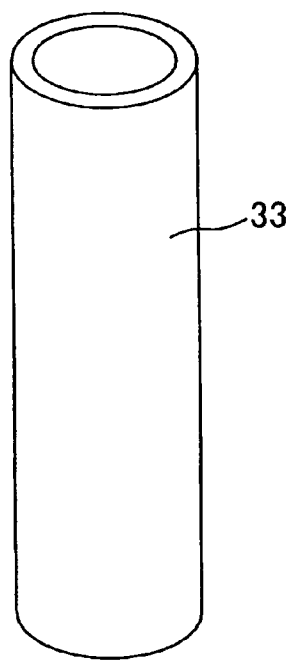
[FIG. 4]
Figure 4:
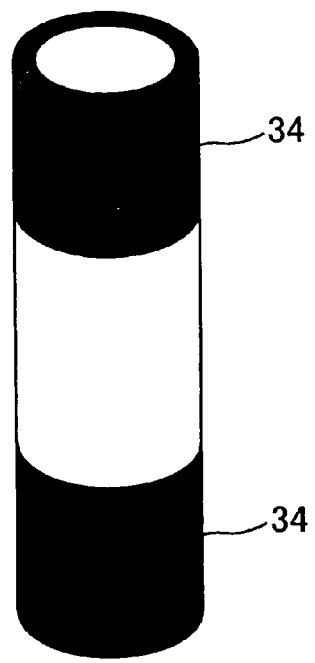
Figure 4:
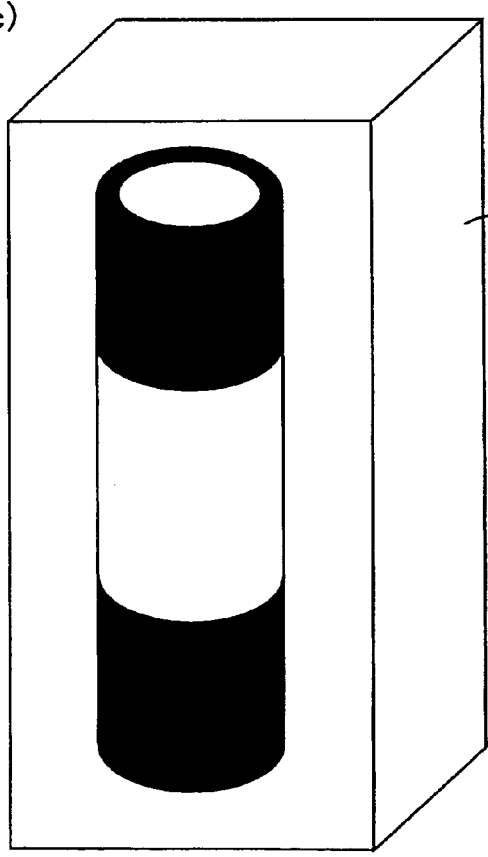
Figure 4:
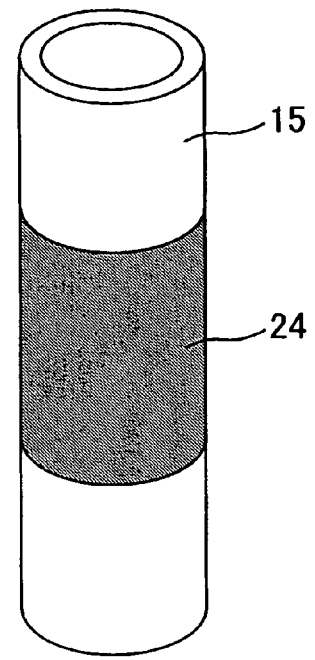
Figure 5:
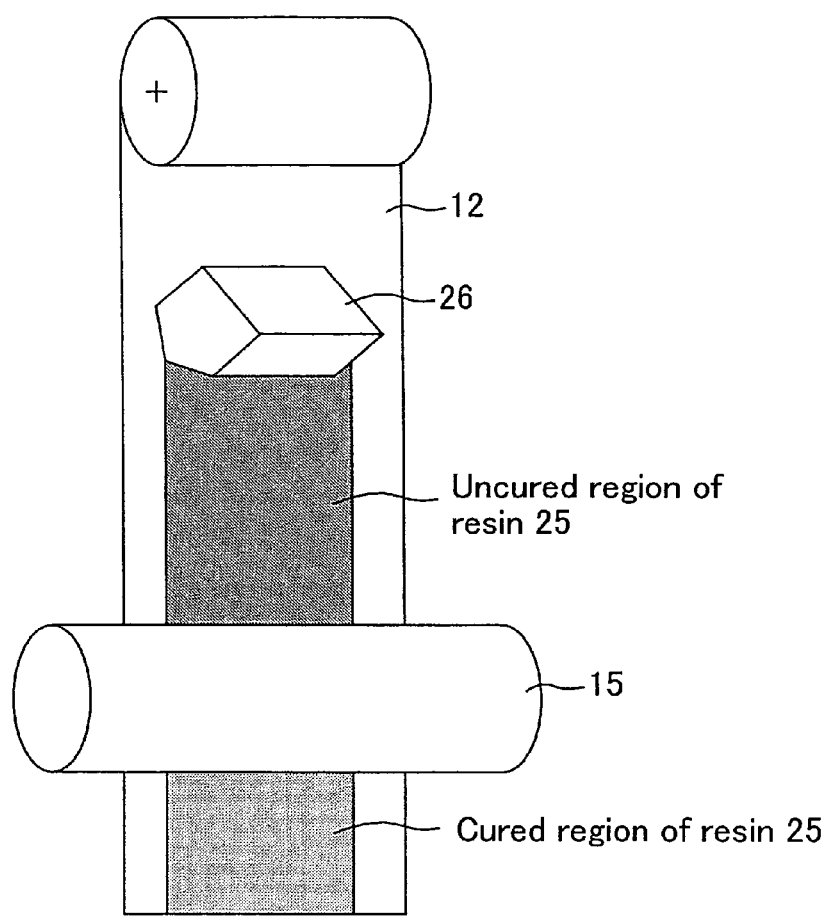
[FIG. 5]
Figure 5:
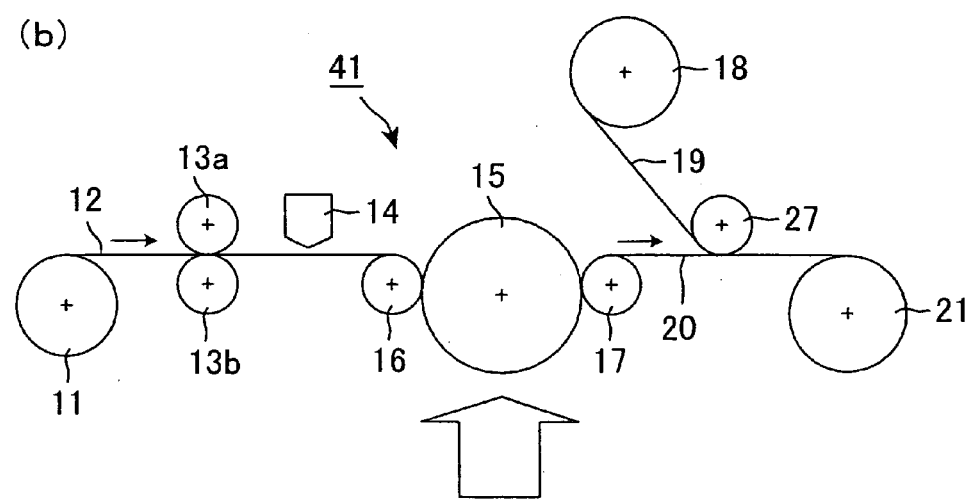
Figure 6:
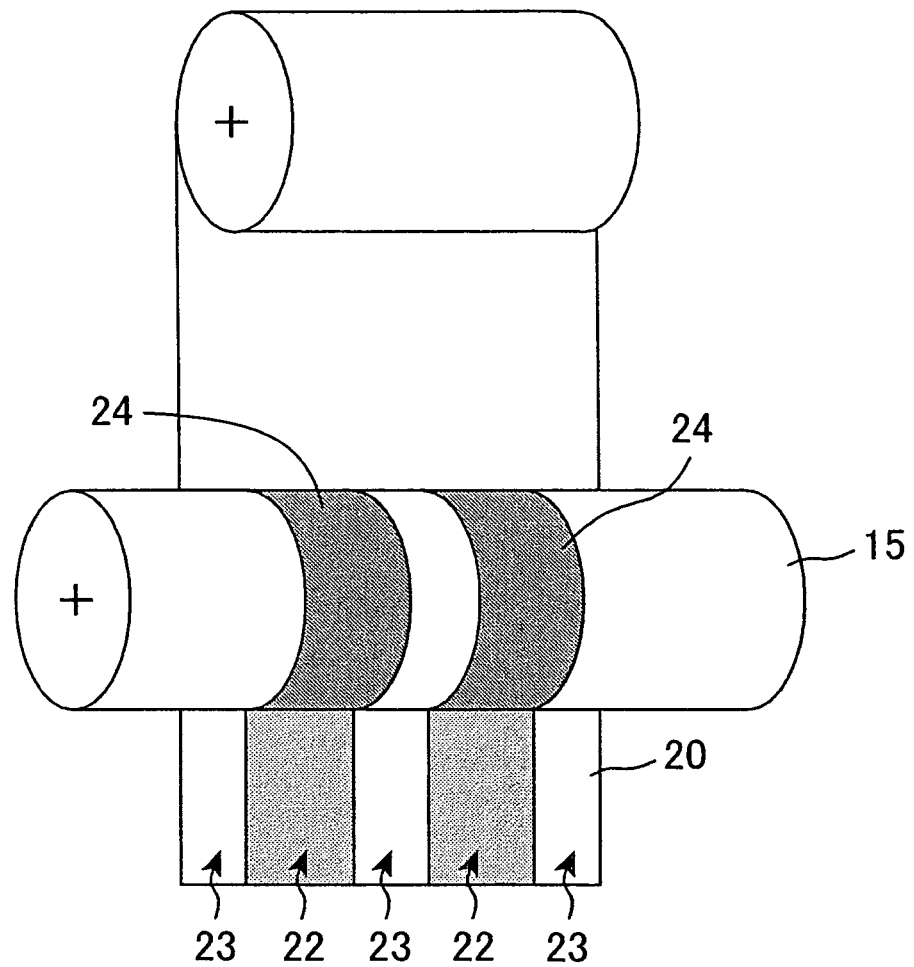
[FIG. 6]

11: Base film roll
12: Base film
13a, 13b, 16, 17, 27: Pinch roller
14: Die coater
15: Mold roller
18: Lamination film roll
19: Lamination film
20: Nanostructure film
21: Rolled optical element (laminated sheet roll)
22: Nanostructure region
23: Nanostructure-free region
24: Region where recess-protrusion pattern is formed
25: Ionizing radiation-curable resin
26: Coating unit
31: Resin film
32: Protrusion
33: Aluminum tube
34: Masking material
35: Reaction vessel
41: Nanoimprinter

The invention claimed is:
1. An optical element, comprising:
a band-shaped nanostructure film including recesses and protrusions in nanometer size formed continuously on a surface of the nanostructure film; and
a band-shaped lamination film attached on the nanostructure film,
wherein the nanostructure film includes a nanostructure-free region free from the recesses and protrusions in nanometer size in both ends along a longitudinal direction of the nanostructure film,
the nanostructure film further including a moth-eye structure on which a plurality of conical protrusions of 150 to 400 nm in height are formed as the recesses and protrusions,
the moth-eye structure is continuously formed in a band-shape along the longitudinal direction of the nanostructure film, and the lamination film is detachably attached to a surface of the nanostructure film and is detachably in contact with the nanostructure-free region of the nanostructure film, wherein a proportion of a width of the nanostructure-free region relative to a dimension of the band-shaped nanostructure film in a width direction is 1% or more.

2. The optical element according to claim 1, wherein the nanostructure film includes a base film having a resin coating on a portion of the base film other than both ends along the longitudinal direction of the nanostructure film.

3. The optical element according to claim 1, wherein the nanostructure-free region has a width of 20 mm or more.

4. The optical element according to claim 1, wherein the nanostructure-free region has a width of 40 mm or less.

5. The optical element according to claim 1, wherein the nanostructure-free region has a width of 20 mm or more and 40 mm or less.

6. The optical element according to claim 1, wherein the proportion of the width of the nanostructure-free region relative to the dimension of the band-shaped nanostructure film in the width direction is substantially 1%.

7. The optical element according to claim 1, wherein the nanostructure-free region has a width of substantially 20 mm.

8. The optical element according to claim 1, wherein the nanostructure-free region has a width of substantially 40 mm.

* * * * *